(12) United States Patent
Fujita

(10) Patent No.: US 8,680,726 B2
(45) Date of Patent: Mar. 25, 2014

(54) SEMICONDUCTOR DEVICE AND DRIVING APPARATUS INCLUDING SEMICONDUCTOR DEVICE

(75) Inventor: Toshihiro Fujita, Obu (JP)

(73) Assignee: Denso Corporation, Kariya (JP)

( * ) Notice: Subject to any disclaimer, the term of this patent is extended or adjusted under 35 U.S.C. 154(b) by 134 days.

(21) Appl. No.: 13/483,223

(22) Filed: May 30, 2012

(65) Prior Publication Data

US 2012/0306328 A1    Dec. 6, 2012

(30) Foreign Application Priority Data

May 30, 2011 (JP) ................................. 2011-120274

(51) Int. Cl.
*H02K 11/00* (2006.01)

(52) U.S. Cl.
USPC ............................................ 310/68 D; 310/64

(58) Field of Classification Search
USPC ............................................ 310/68 D, 64, 71
See application file for complete search history.

(56) References Cited

U.S. PATENT DOCUMENTS

| | | | | |
|---|---|---|---|---|
| 4,972,294 | A | * | 11/1990 | Moses et al. .................. 361/704 |
| 5,060,112 | A | * | 10/1991 | Cocconi ........................ 361/719 |
| 5,659,212 | A | * | 8/1997 | DePetris ....................... 310/68 D |
| 5,932,942 | A | * | 8/1999 | Patyk et al. ...................... 310/58 |
| 5,969,445 | A | * | 10/1999 | Horiuchi et al. ................ 310/64 |
| 6,661,134 | B2 | * | 12/2003 | Sunaga et al. .................. 310/64 |
| 8,120,171 | B2 | | 2/2012 | Koike et al. |
| 2002/0079755 | A1 | * | 6/2002 | Sunaga et al. ............. 310/67 R |

FOREIGN PATENT DOCUMENTS

JP    2007-165426    6/2007

OTHER PUBLICATIONS

Office Action (2 pages) dated May 10, 2013, issued in corresponding Japanese Application No. 2011-120274 and English translation (3 pages).
U.S. Appl. No. 13/483,244 of Masuzawa et al, filed May 30, 2012.

* cited by examiner

*Primary Examiner* — Thanh Lam
(74) *Attorney, Agent, or Firm* — Nixon & Vanderhye PC

(57) ABSTRACT

A semiconductor device includes a semiconductor module and a pressing member configured to press the semiconductor module to a heat radiation member. The semiconductor module includes switching elements, conductors, and a molded member. Each of the switching elements is mounted on a corresponding one of the conductors. The molded member covers the switching elements and the conductors. More than three of the switching elements are disposed around the pressing member. The switching elements are disposed in a region in which a pressure generated between the semiconductor module and the heat radiation member by pressing with the pressing member is greater than or equal to a predetermined pressure with which heat generated from the switching elements is releasable from the semiconductor module to the heat radiation member.

9 Claims, 9 Drawing Sheets

SEMICONDUCTOR DEVICE AND DRIVING APPARATUS INCLUDING SEMICONDUCTOR DEVICE

CROSS REFERENCE TO RELATED APPLICATIONS

The present application is based on and claims priority to Japanese Patent Application No. 2011-120274 filed on May 30, 2011, the contents of which are incorporated in their entirety herein by reference.

TECHNICAL FIELD

The present disclosure relates to a semiconductor device and a driving apparatus including a semiconductor device.

BACKGROUND

Conventionally, it is known that a semiconductor device is fixed to a cooling heat sink with screws and the like. For example, JP-A-2007-165426 discloses that screwed portions are provided at longitudinal end portions of a semiconductor device and the semiconductor device is fixed to a cooling heat sink with screws.

SUMMARY

It is an object of the present disclosure to provide a semiconductor device that can efficiently radiate heat generated therein. Another object of the present disclosure is to provide a driving apparatus including the semiconductor device.

A semiconductor device according to a first aspect of the present disclosure includes a semiconductor module and a pressing member. The semiconductor module includes a plurality of switching elements, a plurality of conductors, and a molded member. The switching elements are related to switching of electric current. Each of the switching elements is mounted on a corresponding one of the conductors. The molded member covers the switching elements and the conductors. The pressing member is configured to press the semiconductor module to a heat radiation member. More than three of the switching elements are disposed around the pressing member. The switching elements are disposed in a region in which a pressure generated between the semiconductor module and the heat radiation member by pressing with the pressing member is greater than or equal to a predetermined pressure with which heat generated from the switching elements is releasable from the semiconductor module to the heat radiation member.

The semiconductor device according to the first aspect can efficiently release heat generated from the switching element to the heat radiation member.

A driving apparatus according to a second aspect of the present disclosure includes a motor and a control unit. The motor includes a winding. The control unit is disposed on a side of the motor in an axial direction of the motor. The control unit includes the semiconductor device according to the first aspect, the heat radiation member, and a substrate. The semiconductor device is electrically coupled with the winding and is pressed to the heat radiation member with the pressing member. The substrate is electrically coupled with the semiconductor module.

The driving apparatus according to the second aspect can efficiently release heat generated from the switching element in the semiconductor device to the heat radiation member.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

The inventors of the present disclosure found the following. In cases where a semiconductor device is fixed to a cooling heat sink at longitudinal end portions, as disclosed in JP-A-2007-165426, there is a possibility that a pressure is not sufficient at a center portion of the semiconductor device far from the screwed portions, the semiconductor device is not adhered to the cooling heat sink, and heat radiation is not sufficient.

In view of the foregoing, embodiments of the present disclosure will be described below.

(First Embodiment)

Figure 1:
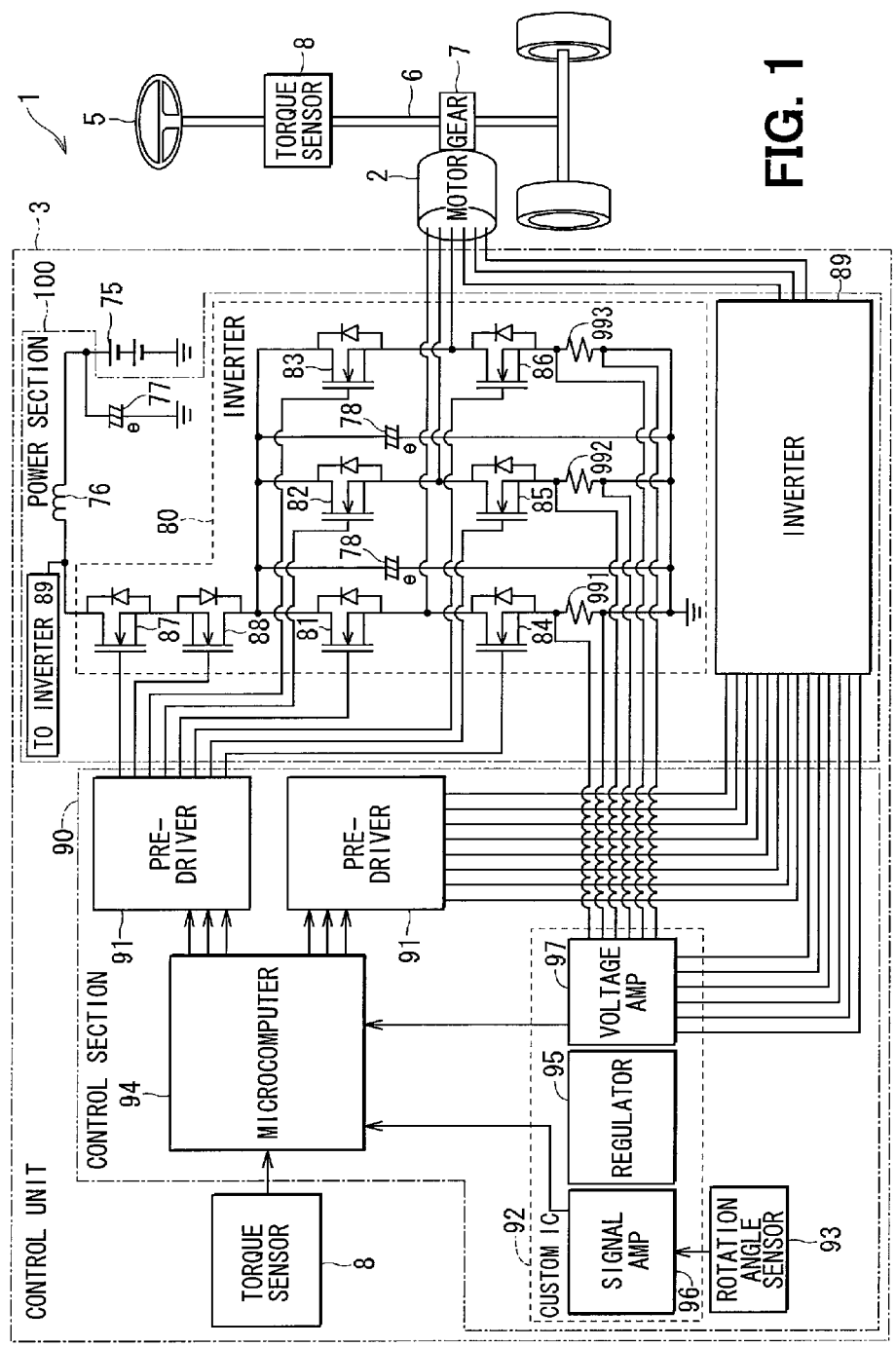
FIG. 1 is a block diagram showing a power steering apparatus according to a first embodiment of the present disclosure.

A driving apparatus 1 including a semiconductor device 101 according to a first embodiment of the present disclosure will be described with reference to FIG. 1 and FIG. 2. The driving apparatus 1 can be applied to an electric power steering apparatus (hereafter, referred to as EPS) that assists a steering operation of a vehicle. The driving apparatus 1 includes a motor 2 and a control unit 3.

An electric configuration of the EPS will be described with reference to FIG. 1. As shown in FIG. 1, the driving apparatus 1 generates a rotation torque at a column shaft 6, which is a rotation axis of a steering wheel 5 of a vehicle, via a gear 7 attached to the column shaft 6 and assists a steering operation with the steering wheel 5. When a driver operates the steering wheel 5, a steering torque generated at the column shaft 6 by the operation is detected with a torque sensor 8. In addition, the driving apparatus 1 receives vehicle information from a controller area network (CAN), which is not shown, to assist the steering operation of the steering wheel 5 by the driver. By using the above-described configuration, the driving apparatus 1 can automatically control the operation of the steering wheel 5 to keep lane in a highway or to guide to a parking space in a parking lot.

The motor 2 is a three-phase brushless motor that rotates the gear 7 forward and reverse. The control unit 3 controls current supply and drive of the motor 2. The control unit 3 includes a power section 100 and a control section 90. The power section 100 is applied with a driving current to drive the motor 2. The control section 90 controls the drive of the motor 2.

The power section 100 includes a choke coil 76, a capacitor 77, and inverters 80, 89. The choke coil 76 is disposed on a power source line from a power source 75. Because the inverter 80 and the inverter 89 have similar configurations, only the configuration of the inverter 80 will be described below. The inverter 80 includes metal-oxide-semiconductor field-effect transistors (MOSFETs) 81-86, which are a kind of field-effect transistor. An on-off state of each of the MOSFETs 81-86 is controlled with a gate potential. In other words, a source and a drain of each of the MOSFETs 81-86 are connected or disconnected by controlling the gate potential.

The drain of the MOSFET 81 is coupled with the power source line and the source of the MOSFET 81 is coupled with the drain of the MOSFET 84. The source of the MOSFET 84 is coupled with the ground via a shunt resistor 991. A junction point of the MOSFET 81 and the MOSFET 84 is coupled with a U-phase coil of the motor 2. The drain of the MOSFET 82 is coupled with the power source line and the source of the MOSFET 82 is coupled with the drain of the MOSFET 85. The source of the MOSFET 85 is coupled with the ground via a shunt resistor 992. A junction point of the MOSFET 82 and the MOSFET 85 is coupled with a V-phase coil of the motor 2. The drain of the MOSFET 83 is coupled with the power source line and the source of the MOSFET 83 is coupled with the drain of the MOSFET 86. The source of the MOSFET 86 is coupled with the ground via a shunt resistor 993. A junction point of the MOSFET 83 and the MOSFET 86 is coupled with a W-phase coil of the motor 2. The MOSFETs 81-83 coupled to a higher potential side than the MOSFETs 84-86 are also called "higher MOSFETs." The MOSFETs 84-86 coupled to a lower potential side are also called "lower MOSFETs."

The inverter 80 further includes MOSFETs 87, 88 for a power source relay. The MOSFETs 87, 88 may have structures similar to the MOSFETs 81-86. The MOSFETs 87, 88 are coupled between the higher MOSFETs 81-83 and the power source 75 and are capable of interrupting electric current in an abnormal state. The MOSFET 87 interrupts a current flow to the motor 2 when a breaking fault or a short fault occurs. The MOSFET 88 can operate as a reverse coupling protection so that a reverse current does not flow when an electronic component, such as the capacitor 78, is coupled in the reverse direction. The MOSFETs 81-88 can operate as switching elements. Each of the higher MOSFETs 81-83 can operate as a high-potential side switching element. Each of the lower MOSFETs 84-86 can operate as a low-potential side switching element. Each of the MOSFETs 81-88 may also be replaced by switching elements other than MOSFETs.

The shunt resistors 991-993 are electrically coupled between the MOSFETs 84-86 and the ground, respectively. The driving apparatus 1 detects electric current that flows to the U-phase coil, the V-phase coil, and the W-phase coil by detecting voltage or electric current applied to the shunt resistors 991-993, respectively.

The choke coil 76 and the capacitor 77 are electrically coupled between the power source 75 and the MOSFET 87 for the power source relay. The choke coil 76 and the capacitor 77 form a filter circuit to reduce noises transmitted from a different device coupled with the power source 75. In addition, the choke coil 76 and the capacitor 77 reduce noises transmitted from the driving apparatus 1 to the different device coupled with the power source 75.

The capacitor 78 is electrically coupled between a power source side of the MOSFETs 81-83 coupled with the power source line and a ground side of the MOSFETs 84-86 coupled with the ground. The capacitor 78 stores electric charge to support power supply to the MOSFETs 81-86 and to reduce a noise component in a surge voltage. The capacitors 77, 78 of the present embodiment may be aluminum electrolytic capacitors. The capacitor 78 has a larger capacity than the capacitor 77. The capacitors 77, 78 may also be capacitors other than aluminum electrolytic capacitors.

The control section 90 includes pre-drivers 91, a custom integrated circuit (custom IC) 92, a rotation angle sensor 93, and a microcomputer 94. The custom IC 92 includes a regulator portion (REGULATOR) 95, a signal amplification portion (SIGNAL AMP) 96, and a voltage amplification portion (VOLTAGE AMP) 97 as functional blocks. The regulator portion 95 is a stabilizing circuit that stabilizes electric power supplied to each component. For example, the microcomputer 94 can operate at a stable predetermined voltage (e.g., 5V) due to the regulator portion 95. The signal amplification portion 96 receives a signal from the rotation angle sensor 93. The rotation angle sensor 93 detects a rotational position signal of the motor 2, and the detected rotational position signal is transmitted to the signal amplification portion 96. The signal amplification portion 96 amplifies the rotational position signal and transmits the amplified signal to the microcomputer 94. The voltage amplification portion 96 detects a voltage between both ends of each of the shunt resistors 991-993, amplifies the voltage, and transmits the amplified voltage to the microcomputer 94.

The microcomputer 94 receives the rotational position signal of the motor 2 and the voltage of both ends of each of the shunt resistors 991-993 via the signal amplification portion 96 and the voltage amplification portion 97. The microcomputer 94 further receives a steering torque signal from the torque sensor 8 attached to the column shaft 6. Furthermore, the microcomputer 94 receives the vehicle information via the CAN. When the microcomputer 94 receives the steering torque signal and the vehicle information, the microcomputer 94 controls the inverter 80 via the pre-driver 91 in accordance with the rotational position signal so as to assist the steering operation with the steering wheel 5 in accordance with a vehicle speed. The microcomputer 94 controls the inverter 80 by changing the gate voltages of the MOSFETs 81-86 via the pre-driver 91, thereby switching the on-off states of the MOSFETs 81-86. In other words, because the gates of the six MOSFETs 81-86 are respectively coupled with six output terminals of the pre-driver 91, the on-off states of the MOSFETs 81-86 can be switched by changing the gate voltage with the pre-driver 91. Furthermore, the microcomputer 94 controls the inverter 80 so that the electric current supplied to the motor 2 becomes closer to a sine wave based on the voltage between both ends of each of the shunt resistors 991-993 transmitted from the voltage amplification portion 97. The control section 90 also controls the inverter 89 in a manner similar to the inverter 80.

Figure 2:
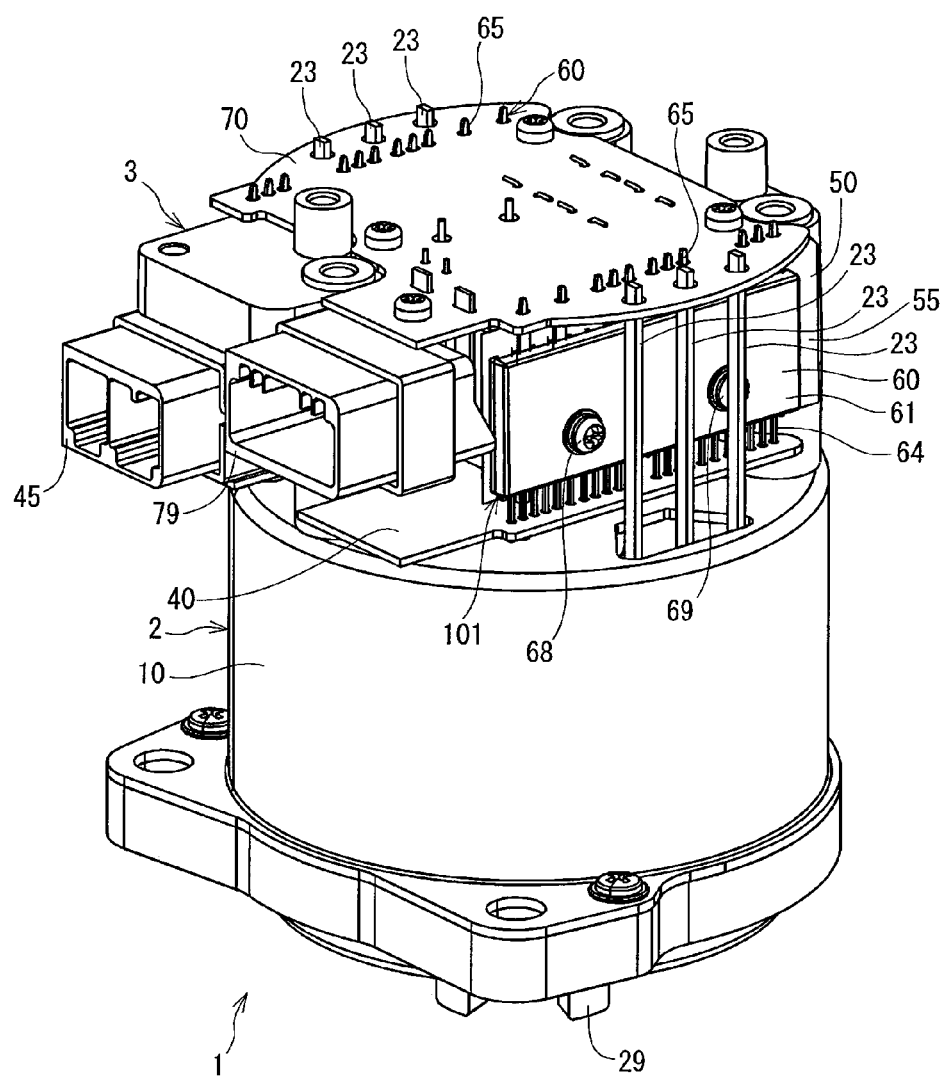
FIG. 2 is a perspective view of a driving apparatus according the first embodiment.

As shown in FIG. 2, the driving apparatus 1 includes the motor 2 and the control unit 3. In the driving apparatus 1 of the present embodiment, the control unit 3 is disposed on one side of the motor 2 in an axial direction of the motor 2. The motor 2 and the control unit 3 form a stacking structure. In FIG. 2, a cover that defines a contour of the control unit 3 is removed.

The motor 2 is the three-phase brushless motor. A contour of the motor 2 is defined by a motor case 10. The motor case 10 has a cylindrical shape and is made of, for example, iron. In the motor case 10, a stator, a rotor, a shaft and the like are disposed. When a winding attached to the stator is subject to a rotating magnetic field, the rotor and the shaft rotate integrally. The winding attached to the stator is the three-phase winding including the U-phase coil, the V-phase coil, and the W-phase coil. Dimensions of the stator, the rotor and the like can be set based on a required output.

Extraction lines 23 are pulled out from six positions in the winding. Three extraction lines 23 are pulled out from a first hole of the motor case 10 toward the control unit 3, and the other three extraction lines 23 are pulled out from a second hole of the motor case 10 toward the control unit 3. The extraction lines 23 extend to a power substrate 70 through a region located radially outside a control substrate 40 and power modules 60. The three extraction lines 23 pulled out from the first hole correspond to the U-phase coil, the V-phase coil, and the W-phase coil, respectively. The three extraction lines 23 pulled out from the second hole correspond to the U-phase coil, the V-phase coil, and the W-phase coil, respectively.

On an opposite side of the shaft from the control unit 3, an output terminal 29 is disposed. In addition, on the opposite side of the shaft from the control unit 3, a gear box (not shown) is disposed. In the gear box, the gear 7 shown in FIG. 1 is disposed. The gear 7 is coupled with the output terminal 29 and is rotated by a driving force of the motor 2.

The control unit 3 includes the control substrate 40, the heat sink 50, the power substrate 70, and the semiconductor device 101. The control substrate 40 can operate as a control substrate or a substrate. The heat sink 50 can operate as a heat radiation member. The power substrate 70 can operate as a substrate. The semiconductor device 101 includes the power module 60 and screws 68, 69. The power module 60 can operate as a semiconductor module. The screws 68, 69 can operate as pressing members. Most components of the control unit 3 except for connectors 45, 79 and the like coupled with external electronic parts are disposed in a motor case region that is defined by projecting the motor case 10 in the axial direction. In the control unit 3, the control substrate 40, the heat sink 50, the power module 60, and the power substrate 70 are disposed in this order from a side adjacent to the motor 2 in the axial direction. In other words, in the axial direction, the motor case 10, the control substrate 40, the heat sink 50, the power module 60, and the power substrate 70 are arranged in this order.

The control substrate 40 may be a four-layer substrate made of glass epoxy substrate. The control substrate 40 has a plate shape which can be disposed within the motor case region. The control substrate 40 is fixed to the heat sink 50 by screwing. On the control substrate 40, electronic parts for forming the control section 90 are mounted. On a surface of the control substrate 40 opposite from the motor 2, the pre-drivers 91, the custom IC 92, and the microcomputer 94 are mounted. On a surface of the control substrate 40 facing the motor 2, the rotation angle sensor 93 is mounted.

The control substrate 40 defines through holes for coupling with the control terminals 64 of the power module 60 along an outer edge thereof. In addition, the control substrate 40 is coupled with a control connector 45. The control connector 45 is configured so that a wire can be coupled from radially outside the motor 2 and the signals from the torque sensor 8 and the CAN are input.

The heat sink 50 is made of material having a high thermal conductivity, such as aluminum. The heat sink 50 includes two heat receiving portions 55 having broad surfaces to which the power modules 60 are fixed. The heat receiving portions 55 are disposed in a direction approximately perpendicular to the motor case 10. Along the two heat receiving portions 55 disposed in parallel with each other, two power modules 60 are disposed. The power modules 60 are respectively fixed to the heat receiving portions 55 with the screws 68, 69.

Each of the power modules 60 includes a molded member 61, control terminals 64, and power terminals 65. The power terminals 65 can operate as winding terminals. The power modules 60 are disposed between the control substrate 40 and the power substrate 70 in the axial direction. The power modules 60a are vertically disposed outside the heat sink 50 in the radial direction of the motor 2. Two power modules 60 are disposed on opposite sides of an extended center line of rotation of the motor 2.

One of the power modules 60 corresponds to the inverter 80 and includes the MOSFETs 81-88, and the shunt resistors 991-993. In the present embodiment, the MOSFETs 81-88, and the shunt resistors 991-993 are integrally molded with resin as one power module. The other power module 60a corresponds to the inverter 89 and includes MOSFETs, power relays, and shunt resistors integrally molded with resin. With respect to the one heat receiving portion 55, one power module 60 for forming one driving system is disposed.

The power substrate 70 may be a four-layer substrate made of a glass epoxy substrate and a pattern copper layer. The power substrate 70 has a plate shape disposed within the motor case region and is fixed to the heat sink 50 by screwing. On the power substrate 70, a power wiring is disposed. The power wiring is supplied with a winding current that is supplied to the winding.

The power substrate 70 defines through holes for coupling with the power terminals 65 of the power modules 60. The power substrate 70 further defines through holes for coupling with the extraction lines 23 outside the through holes to which the power terminals 65 are inserted. The power terminals 65 and the extraction lines 23 inserted into the through holes are electrically coupled with the power substrate 70. Accordingly, the extraction lines 23 are coupled with the power module 60 via the power substrate 70.

On a surface of the power substrate 70 facing the motor 2, the choke coil 76 and the capacitors 77, 78 are mounted. The choke coil 76 and the capacitors 77, 78 are disposed in a space defined in the heat sink 50. The choke coil 76, the capacitors 77, 78, and the power connector 79 are disposed between the power substrate 70 and the control substrate 40 in the axial direction.

The power substrate 70 is coupled with the power connector 79. The power connector 79 is disposed adjacent to the control connector 45, which is coupled with the control substrate 40. The power connector 79 is configured to be coupled with a wiring from radially outside the motor 2 and is coupled with the power source 75. Accordingly, the power substrate 70 is supplied with electric power from the power source 75 via the power connector 79. In addition, the electric power from the power source 75 is supplied to the winding of the motor 2 via the power connector 79, the power substrate 70, the power modules 60 and the extraction lines 23.

An operation of the driving apparatus 1 will be described. The microcomputer 94 mounted on the control substrate 40 generates a pulse signal produced by a pulse-width modulation (PWM) control via the pre-drivers 91, based on the signals from the rotation angle sensor 93, the torque sensor 8, the shunt resistors 991-993 and the like so as to assist the steering operation with the steering wheel 5 in accordance with the vehicle speed. The pulse signal is transmitted to the inverters 80, 89 via the control terminals 64 to control the on-off states of the MOSFETs 81-86. Accordingly, each phase of the winding of the motor 2 is supplied with a sine wave current having a different phase and the rotating magnetic field is generated. By receiving the rotating magnetic field, the rotor and the shaft integrally rotate. When the shaft rotates, the driving force is transmitted from the output terminal 29 to the gear 7 of the column shaft 6 to assist the steering operation with the steering wheel 5 by the driver. In other words, the motor 2 is driven by the winding current supplied to the winding. Thus, it can be said that the winding current supplied to the winding is the drive current that drives the motor 2.

Figure 3:
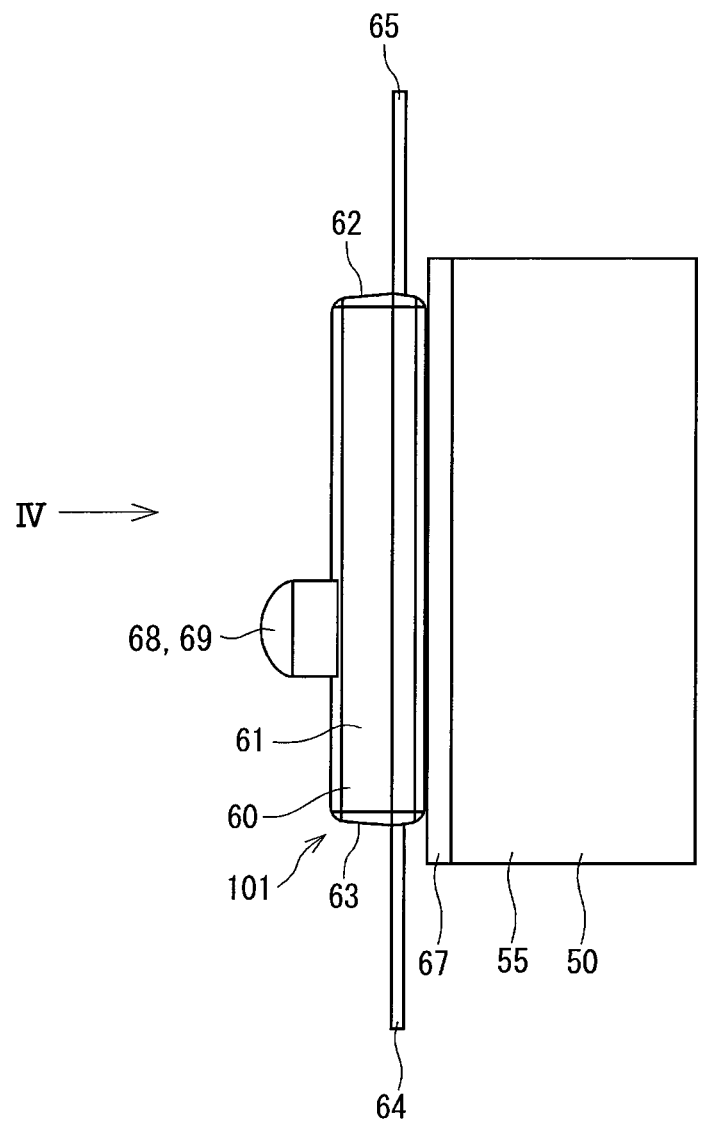
FIG. 3 is a side view showing a semiconductor device fixed to a heat sink.

The semiconductor device 101 will be described with reference to FIG. 3 to FIG. 5. The semiconductor device 101 includes the power module 60, the screws 68, 69 and a heat radiation sheet 67. The heat radiation sheet 67 can operate as a medium member. As shown in FIG. 3, the heat radiation sheet 67 is disposed between the power module 60 and the heat sink 50. The power module 60 and the heat radiation sheet 67 are fixed to the heat sink 50 with the screws 68, 69. Accordingly, the power module 60 is held by the heat sink 50 via the heat radiation sheet 67. Heat generated by supplying electric current to the power module 60 is radiated to the heat sink 50 via the heat radiation sheet 67. The heat radiation sheet 67 is made of insulation material. Thus, the heat radiation sheet 67 transfers heat from the power module 60 to the heat sink 50 and secures isolation between the power module 60 and the heat sink 50. In other words, the heat radiation sheet 67 is an insulation member as well as a heat radiation member. Furthermore, by disposing the heat radiation sheet 67 between the power module 60a and the heat sink 50, adhesion between the power module 60 and the heat sink 50 can be increased.

Figure 4:
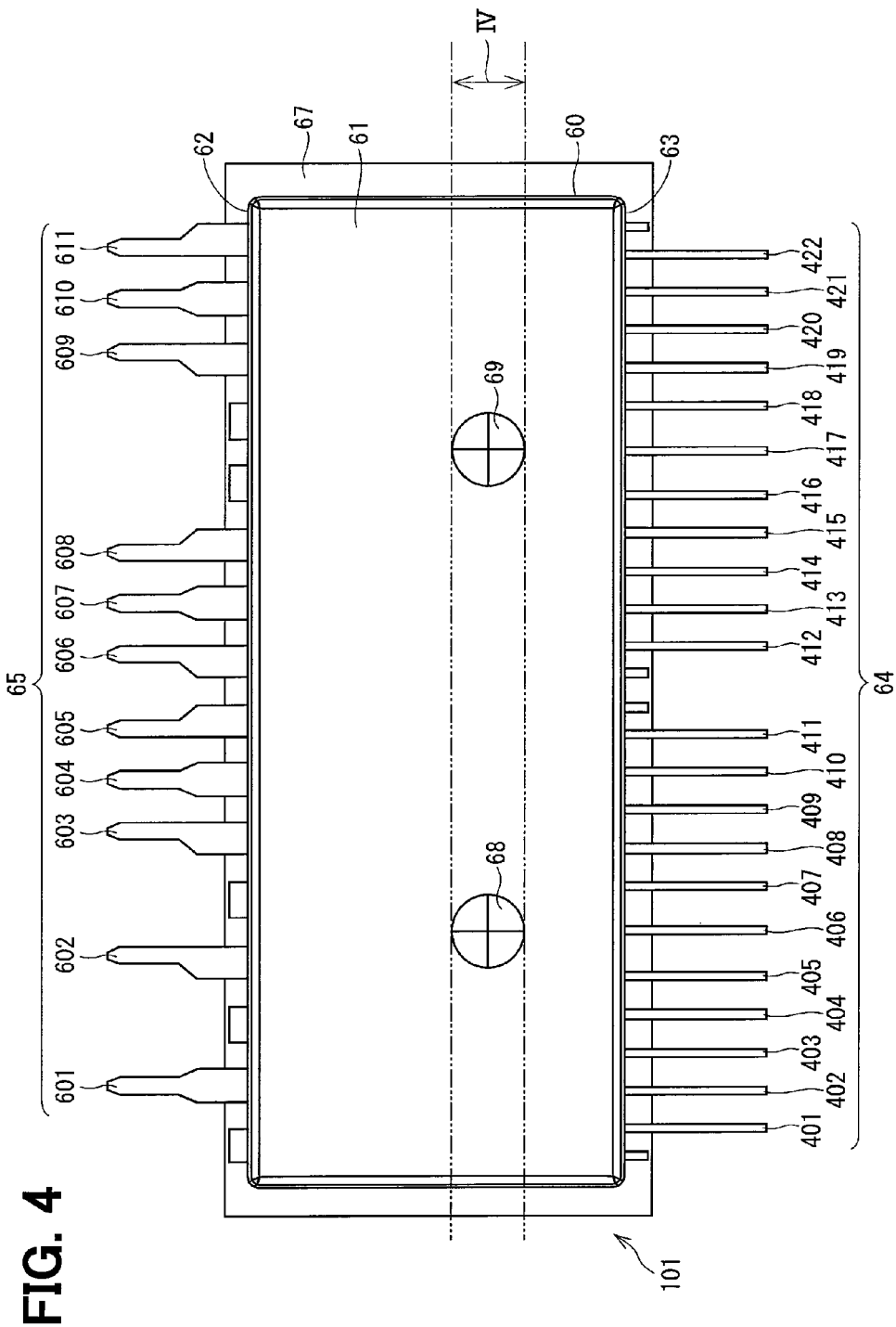
FIG. 4 is a view of the power module seen along arrow IV in FIG. 3.
Figure 5:
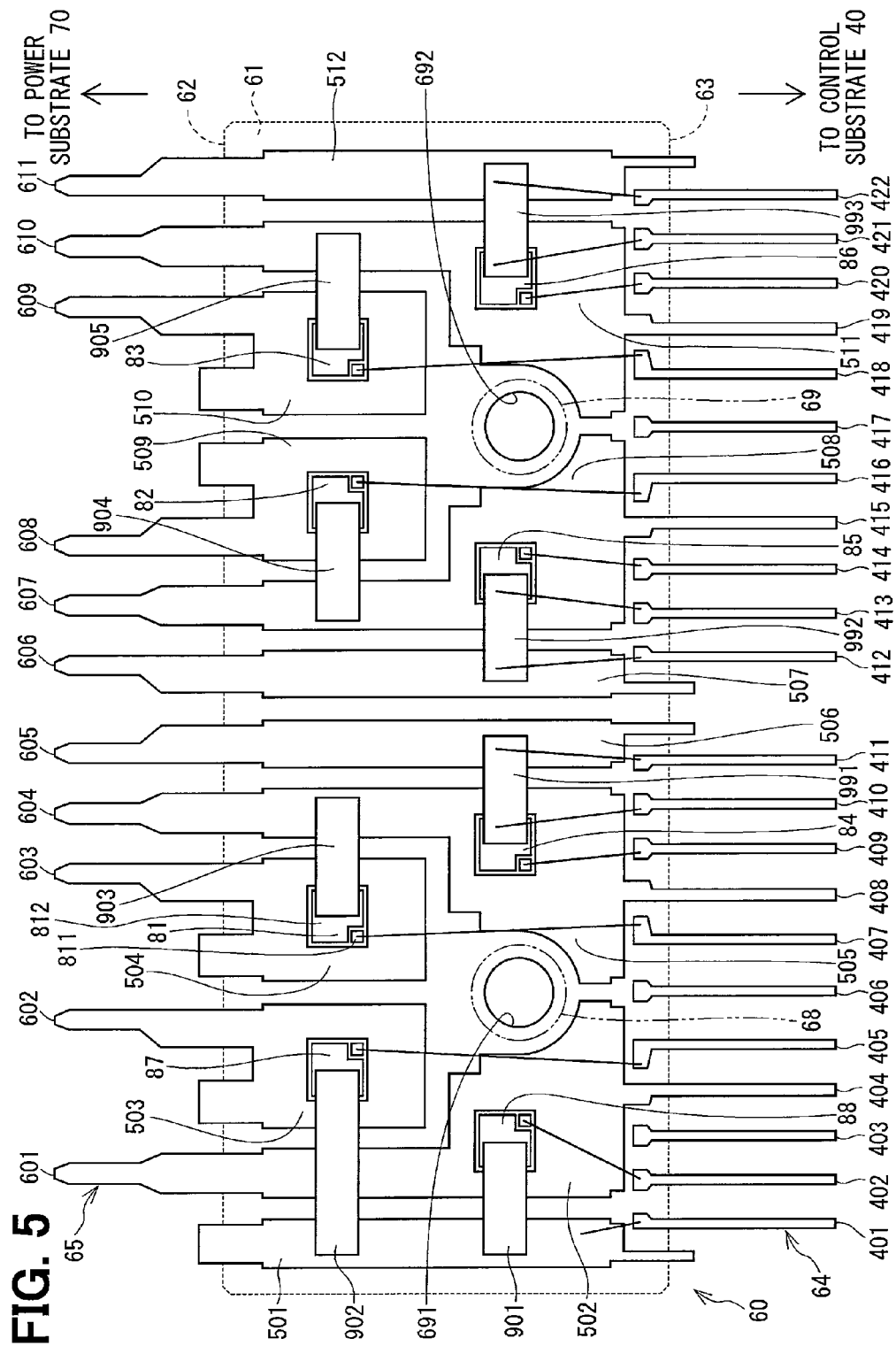
FIG. 5 is a diagram showing an internal configuration of the power module according to the first embodiment.
Figure 6:
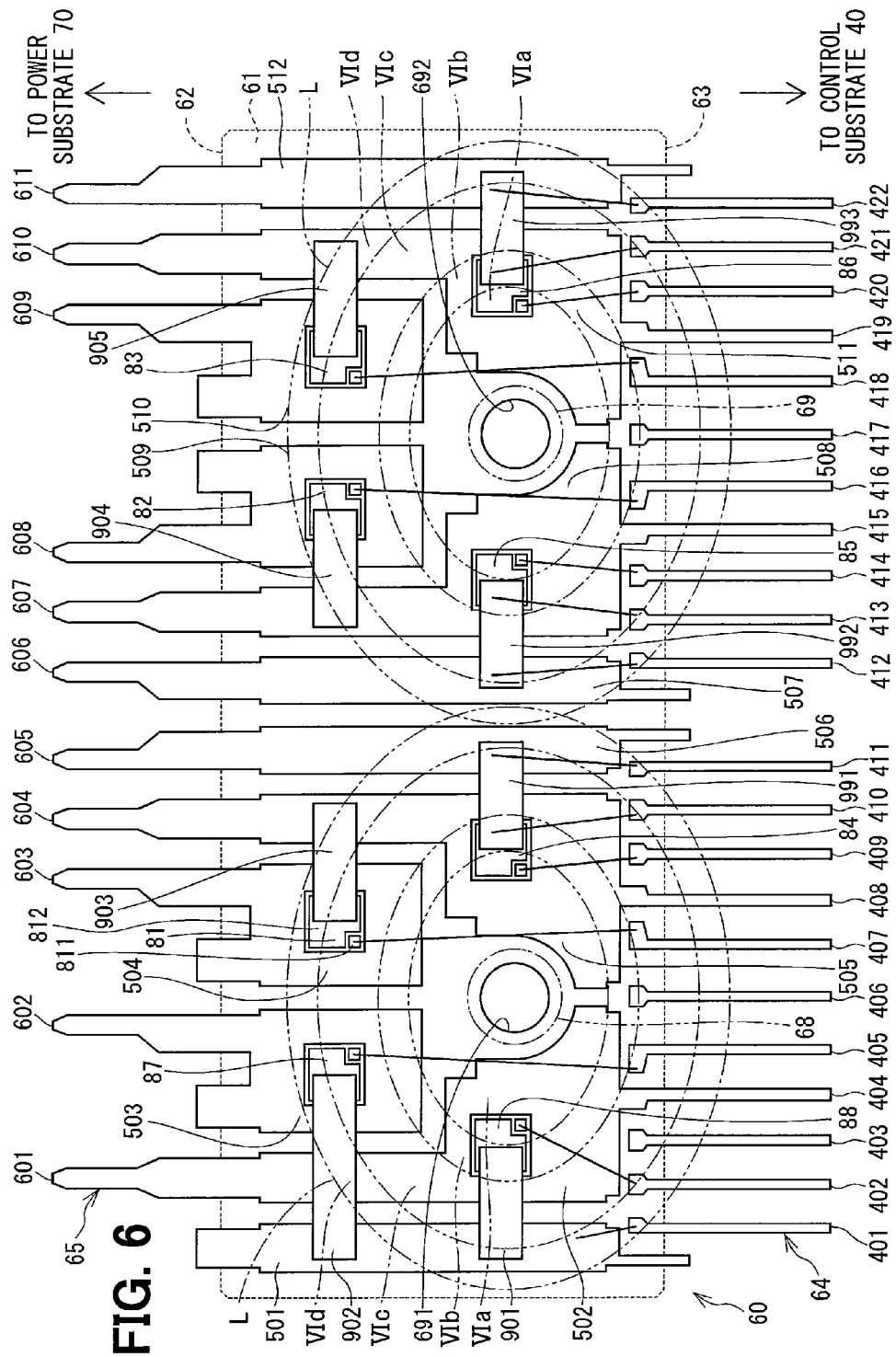
FIG. 6 is a diagram for explaining a pressure in a state where the power module according to the first embodiment is fixed to the heat sink.

As shown in FIG. 3 to FIG. 5, the control terminals 64 and the power terminals 65 protrude outside from the molded member 61. The molded member 61 has a first surface 62 and a second surface 63 parallel to a longitudinal direction of the molded member 61, that is, a width direction of the molded member 61. The power terminals 65 protrude from the first surface 62. The control terminals 64 protrude from the second surface 63. In the present embodiment, the power module 60 is disposed vertically along the heat receiving portion 55 of the heat sink 50 in such a manner that the second surface 63 from which the control terminals 64 protrude is disposed adjacent to the control substrate 40 and the first surface 62 from which the power terminals 65 protrude is disposed adjacent to the power substrate 70. In other words, the control terminals 64 protrude toward the control substrate 40 and the power terminals 65 protrude toward the substrate 70.

The control terminals 64 are inserted into the through holes defined by the control substrate 40 and are electrically coupled with the control substrate 40 with solder and the like. The control signal from the control substrate 40 is transmitted to the power module 60 via the control terminals 64. The power terminals 65 are inserted into the through holes defined by the power substrate 70 and are electrically coupled with the power substrate 70 with a solder and the like. The power terminals 65 are supplied with the winding current that is supplied to the motor 2 through the power substrate 70 and the extraction lines 23. Accordingly, the power module 60 is supplied with the winding current, and the winding current is controlled by switching the on-off states of the MOSFETs 81-88 in the power module 60. In the present embodiment, only a low current (e.g., 200 mA) at a level of relating to the driving control of the motor 2 flows toward the control substrate 40. However, a high current (e.g., 80 A) for driving the motor 2 flows toward the power substrate 70. Thus, each of the power terminals 65 is larger than each of the control terminals 64. In the present embodiment, the control terminals 64 include 22 terminals 401-422 and the power terminals 65 include 11 terminals 601-611. Hereafter, the terminals 401-422 are referred to as control terminals 401-422, and the terminal 601-611 are referred to as power terminals 601-611.

Next, an internal configuration of the power module 60 will be described with reference to FIG. 5. Although FIG. 5 show a configuration of the power module 60 corresponding to the inverter 80, the power module 60 corresponding to the inverter 89 has a similar configuration. As shown in FIG. 5, the power module 60 includes the MOSFETs 81-88 and slugs 501-512 in addition to the molded member 61, the control terminals 401-422, and the power terminals 601-611. The slugs 501-512 can operate as conductors. The molded member 61 is made of resin. The molded member 61 covers the control terminals 401-422, the power terminals 601-611, the MOSFETs 81-88, and the slugs 501-512.

Although it is not shown in FIG. 5, a part of each of the slugs 501-512 that form wiring patterns is exposed from the molded member 61 as a heat radiation portion. In other words, the power module 60 of the present embodiment is a so-called half-molded module. The metal heat radiation portions are in contact with the heat receiving portion 55 of the heat sink 50 via the heat radiation sheet 67, thereby radiating heat efficiently.

The MOSFETs 81-88 are formed of semiconductor chips and are mounted on the slugs 502-505, 508-511. The MOSFET 81 includes a gate 811 and a source 812 disposed on a front surface of the semiconductor chip. The MOSFET 81 further includes the gate disposed on a rear surface of the semiconductor chip. The MOSFETs 82-88 have configurations similar to the MOSFET 81.

In the slugs 501-512, the wiring patterns are formed of copper or copper alloy plate. The slug extends from the first surface 62 to the second surface 63.

The slug is coupled with the control terminal 401 via a wire. The slug 502 extends from the first surface 62 to the second surface 63. The slug 502 is integrally formed with the power terminal 601 and the control terminal 404. The control terminal 404 supplies the power source voltage toward the control substrate 40. In addition, the control terminal 404 is used for monitoring a post-relay voltage that is a voltage at downstream of the MOSFET 87 for the power-source relay. The MOSFET 88 for the reverse coupling protection is mounted on the slug 502. The gate of the MOSFET 88 is coupled with the control terminal 402 via a wire. When the gate voltage of the MOSFET 88 is switched via the control terminal 402, the on-off state of the MOSFET 88 is controlled. The source of the MOSFET 88 is coupled with the slug 501 via a wire 901.

The slug 503 is disposed at a portion in the molded member 61 adjacent to the first surface 62. The slug 503 is integrally formed with the power terminal 602. The MOSFET 87, which interrupts a current flow to the motor 2 when a breaking fault or a short fault occurs, is mounted on the slug 503. The gate of the MOSFET 87 is coupled with the control terminal 405 with a wire. When the gate voltage of the MOSFET 87 is switched via the control terminal 405, the on-off state of the MOSFET 87 is controlled. The source of the MOSFET 87 is coupled with the slug 501 via a wire 902.

The slug 504 is disposed at a portion in the molded member 61 adjacent to the first surface 62. The slug 504 is integrally formed with the power terminal 603. The higher MOSFET 81 for the U-phase coil is mounted on the slug 504. The gate 811 of the higher MOSFET 81 is coupled with the control terminal 407 via a wire. When the gate voltage of the higher MOSFET 81 is switched via the control terminal 407, the on-off state of the higher MOSFET 81 is controlled. The source 812 of the higher MOSFET 81 is coupled with the slug 505 via a wire 903.

The slug 505 extends from the first surface 62 to the second surface 63. The slug 505 is integrally formed with the power terminal 604 and the control terminal 408. The control terminal 408 is used for monitoring a terminal voltage of the U-phase coil. The lower MOSFET 84 for the U-phase coil is mounted on the slug 505. The gate of the lower MOSFET 84 is coupled with the control terminal 409 via a wire. When the gate voltage of the lower MOSFET 84 is switched via the control terminal 409, the on-off state of the lower MOSFET 84 is controlled. The source of the lower MOSFET 84 is coupled with the slug 506 via the shunt resistor 991. An end portion of the shunt resistor 991 adjacent to the lower MOSFET 84 is coupled with the control terminal 410 via a wire. An end portion of the shunt resistor 991 adjacent to the slug 506 is coupled with the control terminal 411 via a wire.

The slug 506 extends from the first surface 62 to the second surface 63 and is integrally formed with the power terminal 605. The slug 507 extends from the first surface 62 to the second surface 63 and is integrally formed with the power terminal 606.

The slug 508 extends from the first surface 62 to the second surface 63.

The slug 508 is integrally formed with the power terminal 607 and the control terminal 415. The control terminal 415 is used for monitoring a terminal voltage of the V-phase coil. The lower MOSFET 85 for the V-phase coil is mounted on the slug 508. The gate of the lower MOSFET 85 is coupled with the control terminal 414 via a wire. When the gate voltage of the lower MOSFET 85 is switched via the control terminal 414, the on-off state of the lower MOSFET 85 is controlled. The source of the lower MOSFET 85 is coupled with the slug 507 via the shunt resistor 992. An end portion of the shunt resistor 992 adjacent to the lower MOSFET 85 is coupled with the control terminal 413 via a wire. An end portion of the shunt resistor 991 adjacent to the slug 507 is coupled with the control terminal 412 via a wire.

The slug 509 is disposed at a portion in the molded member 61 adjacent to the first surface 62. The slug 509 is integrally formed with the power terminal 608. The higher MOSFET 82 for the V-phase coil is mounted on the slug 509. The gate of the higher MOSFET 82 is coupled with the control terminal 416 via a wire. When the gate voltage of the higher MOSFET 82 is switched via the control terminal 416, the on-off state of the higher MOSFET 82 is controlled. The source of the higher MOSFET 82 is coupled with the slug 508 via a wire 904.

The slug 510 is disposed at a portion in the molded member 61 adjacent to the first surface 62. The slug 510 is integrally formed with the power terminal 609. The higher MOSFET 88 for the W-phase coil is mounted on the slug 510. The gate of the higher MOSFET 83 is coupled with the control terminal 418 via a wire. When the gate voltage of the higher MOSFET 83 is switched via the control terminal 418, the on-off state of the higher MOSFET 83 is controlled. The source of the higher MOSFET 83 is coupled with the slug 511 via a wire 905.

The slug 511 extends from the first surface 62 to the second surface 63. The slug 511 is integrally formed with the power terminal 610 and the control terminal 419. The control terminal 419 is used for monitoring a terminal voltage of the W-phase coil. The lower MOSFET 86 for the W-phase coil is mounted on the slug 511. The gate of the lower MOSFET 86 is coupled with the control terminal 420 via a wire. When the gate voltage of the lower MOSFET 86 is switched via the control terminal 420, the on-off state of the lower MOSFET 86 is controlled. The source of the lower MOSFET 86 is coupled with the slug 512 via the shunt resistor 993. An end portion of the shunt resistor 993 adjacent to the lower MOSFET 86 is coupled with the control terminal 421 via a wire. An end portion of the shunt resistor 993 adjacent to the slug 512 is coupled with the control terminal 422 via a wire.

The slug 512 extends from the first surface 62 to the second surface 63 and is integrally formed with the power terminal 611. The control terminals 403, 406, 417, which are not coupled with any of the slugs, the MOSFETs, and the shunt resistors, are separate neighbor control terminals on both sides so as to restrict a short circuit of the neighbor control terminals.

The power terminal 602 is coupled with the power source 75 via the power substrate 70 and the like. The electric power from the power source 75 is supplied to the power terminal 601 via the power terminal 602, the slug 503, the MOSFET 87, the wire 902, the slug 501, the wire 901, the MOSFET 88, and the slug 502. The power terminals 603, 608, 609 are coupled with the power terminal 601 via the power substrate 70. In other words, the power terminals 603, 608, 609 is coupled with the power source 75 via the MOSFETs 87, 88, the power terminals 601, 602, the power substrate 70 and the like. Accordingly, the electric power from the power source 75 is supplied to the power terminals 603, 608, 609 via the MOSFETs 87, 88, the power terminals 602, 601, the power substrate 70 and the like.

The power terminal 604 is coupled with the U-phase coil of the motor 2. The power terminal 605 is coupled with the ground. The power terminal 604 is disposed between the power terminal 603 and the power terminal 605. The power terminal 603 is coupled with the power source 75, and the power terminal 605 is coupled with the ground. The power terminal 603-605 form a U-phase terminal group related to current supply to the U-phase coil. Accordingly, electric current related to the U-phase coil is supplied to the power terminals 603-605, the slugs 504-506, the MOSFETs 81, 84, the wire 903, and the shunt resistor 991. A voltage signal applied to the shunt resistor 991 is transmitted to the control substrate 40 via the control terminals 410, 411. The amount of electric current supplied to the U-phase coil is detected based on the voltage signal.

The power terminal 607 is coupled with the V-phase coil of the motor 2. The power terminal 606 is coupled with the ground. The power terminal 607 is disposed between the power terminal 606 and the power terminal 608. The power terminal 608 is coupled with the power source 75, and the power terminal 606 is coupled with the ground. The power terminal 606-608 form a V-phase terminal group related to current supply to the V-phase coil. Accordingly, electric current related to the V-phase coil is supplied to the power terminals 606-608, the slugs 507-509, the MOSFETs 82, 85, the wire 904, and the shunt resistor 992. A voltage signal applied to the shunt resistor 992 is transmitted to the control substrate 40 via the control terminals 412, 413. The amount of electric current supplied to the V-phase coil is detected based on the voltage signal.

The power terminal 610 is coupled with the W-phase coil of the motor 2. The power terminal 611 is coupled with the ground. The power terminal 610 is disposed between the power terminal 609 and the power terminal 611. The power terminal 609 is coupled with the power source 75, and the power terminal 611 is coupled with the ground. The power terminal 609-611 form a W-phase terminal group related to current supply to the W-phase coil. Accordingly, electric current related to the W-phase coil is supplied to the power terminals 609-611, the slugs 510-512, the MOSFETs 83, 86, the wire 905, and the shunt resistor 993. A voltage signal applied to the shunt resistor 993 is transmitted to the control substrate 40 via the control terminals 421, 422. The amount of electric current supplied to the W-phase coil is detected based on the voltage signal.

In the present embodiment, the molded member 61 defines an insertion hole 691 at a position between the slug 502 and the slug 505 and between the second surface 63 and the slugs 503, 504. Sides of the slugs 502, 505 adjacent to the insertion hole 691 are cut out into arc shapes corresponding to a shape of the insertion hole 691. The molded member 61 further defines an insertion hole 692 at a position between the slug 508 and the slug 511 and between the second surface 63 and the slugs 509, 510. Sides of the slugs 508, 511 adjacent to the insertion hole 692 are cut out into arc shapes corresponding to a shape of the insertion hole 692.

The slug 502 and the slug 505 have shapes that are line symmetry with respect to a line that passes through a center of the insertion hole 691 and is perpendicular to the first surface 62 and the second surface 63. The slug 503 and the slug 504 have shapes that are line symmetry with respect to the line that passes through the center of the insertion hole 691 and is perpendicular to the first surface 62 and the second surface 63 except for portions at which the power terminals 602, 603 are formed. The slug 508 and the slug 511 have shapes that are line symmetry with respect to a line that passes through a center of the insertion hole 692 and is perpendicular to the first surface 62 and the second surface 63. The slug 509 and the slug 510 have shapes that are line symmetry with respect to the line that passes through the center of the insertion hole 692 and is perpendicular to the first surface 62 and the second surface 63.

The screws 68, 69 for fixing the power module 60 to the heat sink 50 are inserted into the insertion holes 691, 692, respectively. The insertion holes 691, 692 are closer to the second surface 63 than the first surface 62. In other words, the molded member 61 has a middle line that is equidistant from the first surface 62 and the second surface 63, and the insertion holes 691, 692 are defined between the middle line and the second surface 63. A distance between the insertion hole 691 and the second surface 63 is equal to a distance between the insertion hole 692 and the second surface 63. In the present application, "equal" means not only "exactly equal" but also "substantially equal."

In the present embodiment, the MOSFETs 81, 84, 87, 88 are disposed around the screw 68 inserted into the insertion hole 691. The MOSFETs 81, 87 are disposed between the screw 68 and the first surface 62, and a distance between the first surface 62 and the MOSFET 81 is equal to a distance between the first surface 62 and the MOSFET 87. In addition, the MOSFET 81, 87 are disposed symmetrically with respect to a line that passes through a center of the screw 68 and is perpendicular to the first surface 62 and the second surface 63. The MOSFETs 84, 88 are disposed on either side of the screw 68 in the longitudinal direction of the power module 60. The MOSFETs 84, 88 are disposed such that the most part of the MOSFETs 84, 88 is included in a region IV shown in FIG. 4 defined by a line that passes through an end of the screw 68 facing toward the first surface 62 (i.e., an upper end of the screw 68) and is parallel to the second surface 63 and a line that passes through an end of the screw 68 facing toward the second surface 63 (i.e., a lower end of the screw 68) and is parallel to the second surface 63. In addition, the MOSFETs 84, 88 are disposed symmetrically with respect to the line that passes through the center of the screw 68 and is perpendicular to the first surface 62 and the second surface 63.

The MOSFETs 82, 83, 85, 86 are disposed around the screw 69 inserted into the insertion hole 692. The MOSFETs 82, 83 are disposed between the screw 69 and the first surface 62, and a distance between the first surface 62 and the MOSFET 82 is equal to a distance between the first surface 62 and the MOSFET 83. In addition, the MOSFETs 82, 83 are disposed symmetrically with respect to a line that passes through a center of the screw 69 and is perpendicular to the first surface 62 and the second surface 63. The MOSFETs 85, 86 are disposed on either side of the screw 69 in the longitudinal direction of the power module 60. The MOSFETs 85, 86 are disposed such that the most part of the MOSFETs 84, 88 is included in the region IV shown in FIG. 4 defined by a line that passes through an end of the screw 69 facing the first surface 62 (i.e., an upper end of the screw 69) and is parallel to the second surface 63 and a line that passes through an end of the screw 69 facing the second surface 63 (i.e., a lower end of the screw 69) and is parallel to the second surface 63. In addition, the MOSFETs 85, 86 are disposed symmetrically with respect to the line that passes through the center of the screw 69 and is perpendicular to the first surface 62 and the second surface 63.

When the power module 60 is fixed to the heat sink 50 with the screws 68, 69, a pressure between the power module 60 and the heat sink 50 decreases with a distance from each of the screws 68, 69. When points subject to an equal pressure are connected with a line, a region VIa, a region VIb, a region VIc, and a region VId can be defined in descending order of the pressure. When a dashed-two dotted line L that defines an outer periphery of the region VIa indicates a minimum pressure required for adhering the power module 60 to the heat sink 50, the power module 60 and the heat sink 50 do not sufficiently adhere to each other outside the region VId because the pressure is small. Thus, if an electronic component that generates heat, such as a switching element, is disposed outside the region VId, the heat generated at the electronic components cannot be released to the heat sink 50 efficiently.

Thus, in the present embodiment, all the MOSFETs 81-88 are disposed inside the dashed-two dotted line L. In other words, the MOSFETs 81-88 are disposed in a region where the pressure is greater than or equal to a predetermined pressure with which heat generate from the MOSFETs 81-88 is releasable from the power module 60 to the heat sink 50. Accordingly, heat generated due to the switching operations of the MOSFETs 81-88, which are related to the switching of the winding current, can be efficiently released to the heat sink 50.

Furthermore, the MOSFETs 81, 84, 87, 88 are disposed in the region in which the pressure generated by tightening the screw 68, which is inserted into the insertion hole 691, to the heat sink 50 is greater than or equal to the predetermined pressure. The MOSFETs 82, 84, 85, 86 are disposed in the region in which the pressure generated by tightening the screw 69, which is inserted into the insertion hole 692, to the heat sink 50 is greater than or equal to the predetermined pressure. In this way, more than three (four in the present embodiment) MOSFETs are disposed in the region in which the pressure generated by one of the screws 68, 69 is greater than or equal to the predetermined pressure. The number of components required for securing the pressure greater than or equal to the predetermined pressure can be reduced by disposing more than three MOSFETs around each of the screws 68, 69.

The predetermined pressure required for releasing heat generated from the MOSFETs 81-88 to the heat sink 50 is a pressure that can adhere the power module 60 and the heat receiving portion 55 of the heat sink 50. For example, the predetermined pressure is 0.5 MPa. The predetermined pressure depends on properties of the heat radiation sheet 67. For example, when airspace is present in the heat radiation sheet 67, the predetermined pressure is a pressure that can compress the airspace. The predetermined pressure also depends on a flatness of a surface of the power module 60 facing the heat sink 50 and a flatness of the heat receiving portion 55 of the heat sink 50.

As described above, the semiconductor device 101 includes the power module 60 and the screws 68, 69. The power module 60 includes the MOSFETs 81-88, the slugs 501-512, and the molded member 61. On the slugs 501-512, the MOSFETs 81-88 are respectively disposed. The molded member 61 covers the MOSFETs 81-88 and the slugs 501-512. The screws 68, 69 press the power module 60 to the heat sink 50. With respect to each of the screws 68, 69, more than three of the MOSFETs 81-88 are disposed. In the present embodiment, the MOSFETs 81, 84, 87, 88 are disposed around the screw 68, and the MOSFETs 82, 83, 85, 86 are disposed around the screw 69. Furthermore, the MOSFETs 81-88 are disposed in the region in which the pressure generated between the power module 60 and the heat sink 50 by pressing with the screws 68, 69 is greater than or equal to the predetermined pressure with which the heat from the MOSFETs 81-88 is releasable from the power module 60 to the heat sink 50.

The semiconductor device 101 according to the present embodiment has the following advantages.

(i) In the present embodiment, the MOSFETs 81-88 are disposed in the region around the screws 68, 69 in which the pressure generated between the power module 60 and the heat sink 50 is greater than or equal to the predetermined pressure with which heat generated from the MOSFETs 81-88 is releasable from the power module 60 to the heat sink 50. Thus, in the region in which the MOSFETs 81-88 are disposed, the power module 60 and the heat sink 50 can be adhered to each other. Accordingly, heat generated at the MOSFETs 81-88 can be efficiently released to the heat sink 50. Furthermore, because at least three of the MOSFETs 81-88 are disposed with respect to each of the screws 68, 69, the number of pressing members (e.g., the screws 68, 69 in the present embodiment) for pressing the power module 60 to the heat sink 50 can be reduced. Accordingly, the number of process for attaching the screws 68, 69 can be reduced. Furthermore, because an area required for pressing by the screws 68, 69 can be reduced, the dimension of the semiconductor device 101 can be reduced.

(ii) The power module 60 includes the power terminals 65 and the control terminals 64. The power terminals 65 protrude from the first surface 62 of the molded member 61 and are coupled with the winding of the motor 2 via the power substrate 70 and the extraction lines 23. The control terminals 64 protrude from the second surface 63 of the molded member 61 opposite from the first surface 62 and are coupled with the control substrate 40. To the power terminals 65, the high current supplied to the winding flows. To the control terminals 64, a relatively low current at a level of enabling a transmission of the control signal flow. Because the power terminals 65 concentrate in a region adjacent to the first surface 62, a high current does not flow to a region adjacent to the second surface 63. Thus, the shunt resistors 991-993, which are susceptible to a high current, can be appropriately disposed in the region adjacent to the second surface 63.

(iii) The screws 68, 69 are disposed between middle line of the molded member 61 and the second surface 63. At least one of the MOSFETs 81-88 is disposed between the screws 68, 69 and the first surface 62. In the present embodiment, the higher MOSFETs 81-83 and the MOSFET 87 for the power source relay are disposed between the screws 68, 69 and the first surface 62. In addition, at least one of the MOSFETs 81-88 is disposed in a region from which a distance to the second surface is equal to a distance between each of the screws 68, 69 and the second surface 63. In the present embodiment, at least a part of each of the lower MOSFETs 84-86 and the MOSFET 88 is disposed in the region IV defined by the line that passes through the ends of the screws 68, 69 facing toward the first surface 62 and is parallel to the second surface 63 and the line that passes through the ends of the screws 68, 69 facing toward the second surface 63 and is parallel to the second surface 63. The MOSFET 81 and the MOSFET 87 are disposed between the screw 68 and the first surface 62. The MOSFET 84 and the MOSFET 88 are disposed on either side of the screw 68 and are disposed in the region from which the distance to the second surface 63 is equal to the distance between the screw 68 and the second surface 63. The MOSFET 82 and the MOSFET 83 are disposed between the screw 69 and the first surface 62. The MOSFET 85 and the MOSFET 86 are disposed on either side of the screw 69 and are disposed in the region from which the distance to the second surface 63 is is equal to the distance between the screw 69 and the second surface 63.

(iv) In the present embodiment, the screws 68, 69 operate as the pressing members. Accordingly, the power module 60 can be pressed to the heat sink 50 with simple configurations.

(v) In the present embodiment, the heat radiation sheet 67 is disposed between the power module 60 and the heat sink 50. Accordingly, the adhesion between the power module 60 and the heat sink 50 can be improved. Furthermore, because the heat radiation sheet 67 is made of the insulation material, the isolation between the power module 60 and the heat sink 50 can be secured.

(vi) The semiconductor device 101 according to the present embodiment can be included in the driving apparatus 1. The driving apparatus 1 includes the motor 2 and the control unit 3. The control unit 3 includes the semiconductor device 101, the heat sink 50, the control substrate 40, and the power substrate 70. The control unit 3 is disposed on the one side of the motor 2 in the axial direction of the motor 2. The power module 60 of the semiconductor device 101 is electrically coupled with the winding of the motor 2 via the power substrate 70 and the extraction lines 23. The power module 60 is pressed to the heat sink 50 by the screws 68, 69. The control substrate 40 and the power substrate 70 are electrically coupled with the power module 60. Accordingly, heat generated from the MOSFETs 81-88 due to switching of the current supply to the winding of the motor 2 can be efficiently released to the heat sink 50.

(Second Embodiment)

Figure 7:
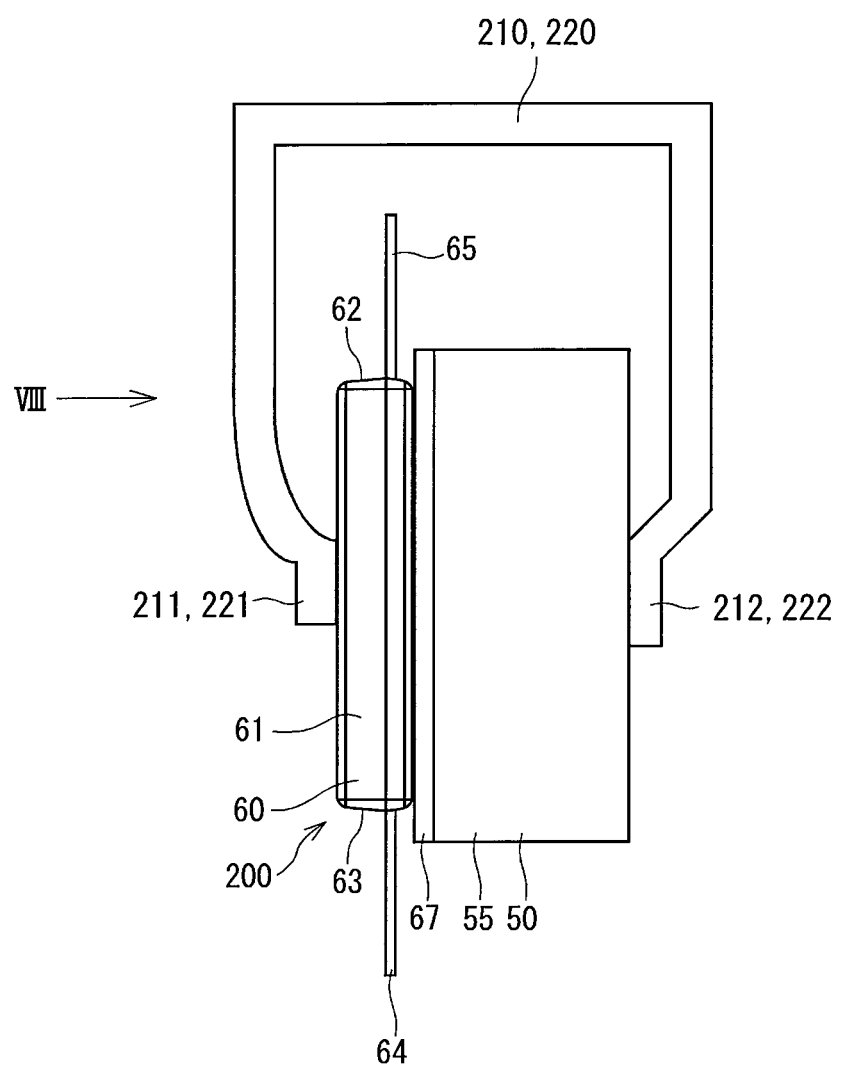
FIG. 7 is a diagram showing a state where a power module according to a second embodiment of the present disclosure is fixed to a heat sink.
Figure 8:
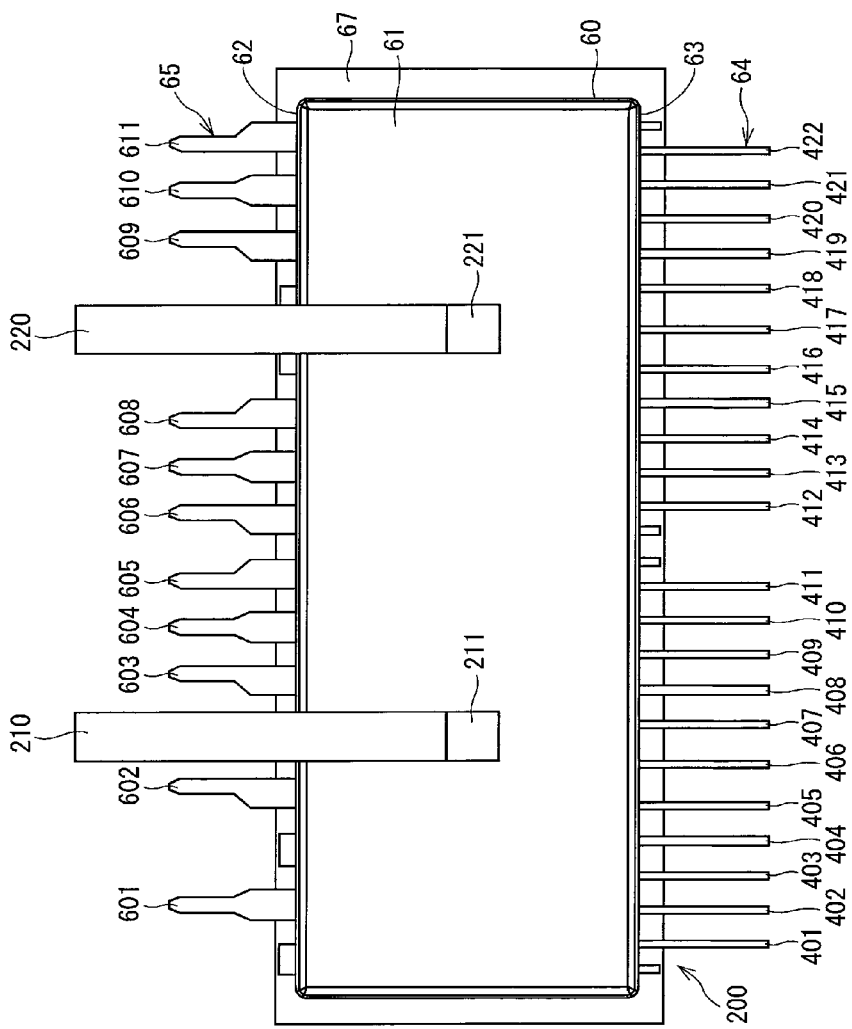
FIG. 8 is a view of the power module seen along arrow VIII in FIG. 7.

A semiconductor device 200 according to a second embodiment of the present disclosure will be described with reference to FIG. 7 and FIG. 8. In the semiconductor device 200, spring members 210, 220 operate as pressing members. Each of the spring members 210, 220 is made of a plate spring and has a U shape when seen from one side. The spring member 210 includes pressing portions 211, 212 at either end thereof. The spring member 210 is inserted between the power terminal 602 and the power terminal 603 from outside the first surface 62 and holds the power module 60, the heat radiation sheet 67, and the heat sink 50 between the pressing portions 211, 212. The spring member 220 includes pressing portions 221, 222 at either end thereof. The spring member 220 is inserted between the power terminal 608 and the power terminal 609 from outside the first surface 62 and holds the power module 60, the heat radiation sheet 67, and the heat sink 50 between the pressing portions 221, 222. Accordingly, the power module 60 is pressed to the heat sink 50 by the spring members 210, 220.

The MOSFETs 81-88 are disposed around one of the pressing portions 211, 221 in a region in which a pressure generated between the power module 60 and the heat sink 50 is greater than or equal to a predetermined pressure with which heat is releasable from the power module 60 to the heat sink 50. The MOSFETs 81, 84, 87, 88 are disposed around the pressing portion 211 and the MOSFETs 82, 83, 85, 86 are disposed around the pressing portion 221. In view of reliability of the MOSFETs 81-88, the MOSFETs 81-88 may be disposed around portions pressed by the pressing portions 211, 221 and portions in the vicinity of the pressed portions.

In the present embodiment, the spring members 210, 220 operate as the pressing members. Even if the molded member 61 deforms due to the pressure and the like, the spring members 210, 220 can press the power module 60 to the heat sink 50. Thus, heat generated from the MOSFETs 81-88 in the power module 60 can be efficiently released to the heat sink 50.

The spring members 210, 220 press the power module 60 only at the pressing portions 211, 221 and do not press the whole area of the power module 60. Thus, the spring members 210, 220 can have simple structures. Furthermore, unlike cases where screws are used as pressing members as disclosed in the first embodiment, it is not necessary to provide insertion holes in the power module 60 and screw holes in the heat sink 50. The semiconductor device 200 further have advantages similar to the above-described advantages (i)-(iii), (v), (vi) of the first embodiment.

(Other Embodiments)

Figure 9A:
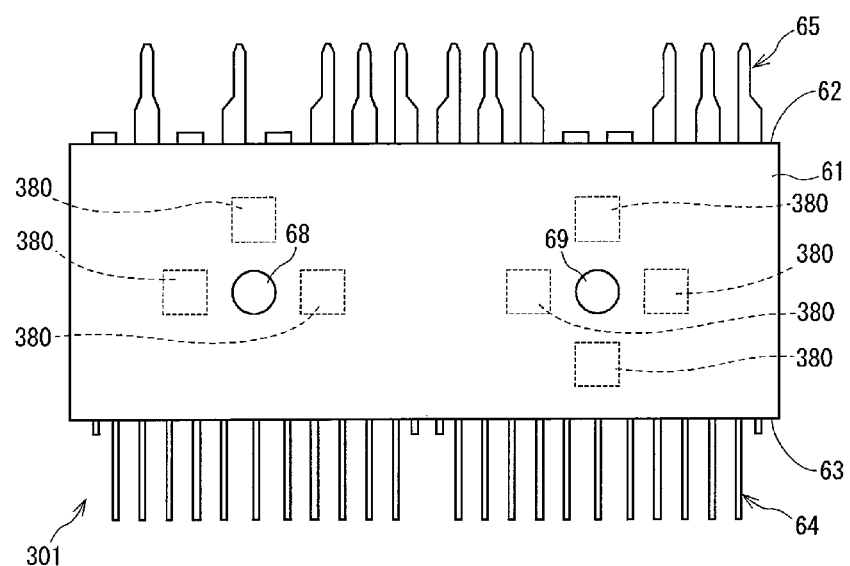
FIG. 9A is a plan view of a power module according to another embodiment of the present disclosure and FIG. 9B is a plan view of a power module according to another embodiment of the present disclosure.
Figure 9B:
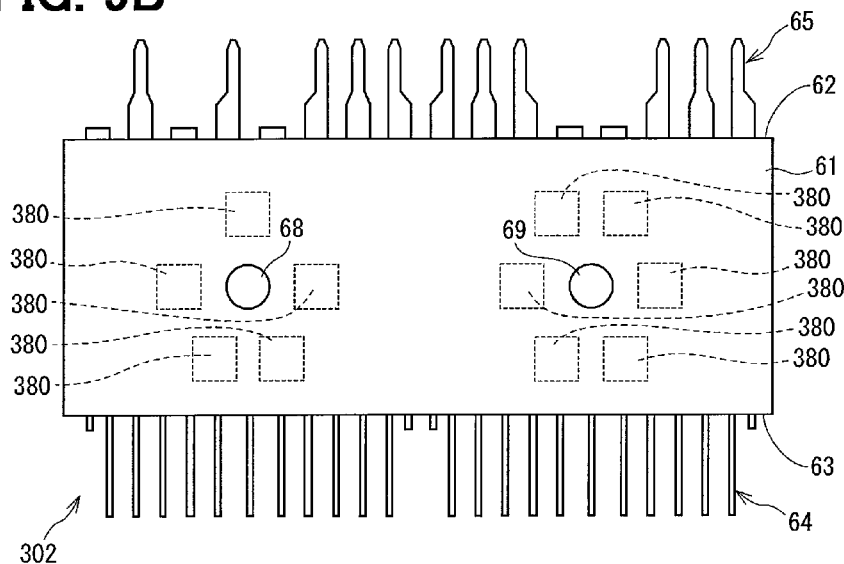

In the above-described embodiments, four switching elements are disposed around one pressing member. In another embodiment, for example, as a power module 301 shown in FIG. 9A, three MOSFETs 381 as switching elements may be disposed around one screw 68. The MOSFETs 381 may be disposed in various arrangements as long as the MOSFETs 381 are disposed in a region in which the pressure generated by pressing is greater than or equal to the predetermined pressure. For example, two MOSFETs 380 may be disposed on either side of a screw 69, and two MOSFETs 380 may be disposed on a side of the screw 69 facing the first surface 62 and a side of the screw 69 facing the second surface 63. More than three switching elements may also be disposed in the region in which the pressure generated by pressing with one pressing member is greater than or equal to the predetermined pressure. For example, as a power module 302 shown in FIG. 9B, five MOSFETs 380 may be disposed around one screw 68 and six MOSFETs 380 may be disposed around one screw 69. In the above-described embodiment, two pressing members are provided to one power module. In another embodiment, one pressing member may be provided to one power module, or more than two pressing members may be provided to one power module.

In the above-described embodiments, three higher MOSFETs and three lower MOSFETs corresponding to the three-phase winding and two MOSFETs for the power source relay, that is, eight MOSFETs are disposed in one power module. The MOSFETs 87, 88 for the power source relay, the MOSFETs 81, 84 for the U-phase coil, the MOSFETs 82, 85 for the V-phase, and the MOSFETs 83-86 for the W-phase coil are disposed in this order from left. In another embodiment, the MOSFETs for the power source relay and the MOSFETs for each coil may be disposed in a different order. The MOSFETs for the power source relay may be omitted. Only higher MOSFETs or only lower MOSFETs may also be disposed in one power module. In cases where a motor is a blushed motor, four MOSFETs may also be disposed in one power module.

In the above-described embodiments, the higher MOSFETs are disposed between the first surface and the pressing members, and the lower MOSFETs are disposed in the region from which the distance to the second surface is equal to the distance between the pressing members and the second surface. In another embodiment, the lower MOSFETs may be disposed between the pressing members and the first surface, and the higher MOSFETs may be disposed in the region from which the distance to the second surface is equal to the distance between the pressing members and the second surface. The positions of the MOSFETs may also be different from phase to phase.

In the above-described embodiments, the MOSFETs are disposed in the region in which the pressure between the power module and the heat sink is greater than or equal to the predetermined pressure (hereafter, referred to as a first predetermined pressure) with which heat from the MOSFETs is releasable to the heat sink. In another embodiment, in view of reliability and the like of the MOSFETs, the MOSFETs may be disposed in a region in which the pressure between the power module and the heat sink is greater than or equal to the first predetermined pressure and is not greater than a second predetermined pressure that is greater than the first predetermined pressure and does not adversely affect the MOSFETs.

In the above-described embodiments, the heat radiation sheet is disposed as the medium member between the power module and the heat sink. In another embodiment, the medium member may be heat radiation gel or adhesive agent. The medium member may be omitted.

In the above-described embodiments, the power module is so-called "half mold" in which a part of the slugs forming the wiring pattern on a surface of power module is exposed from the molded member as metal heat radiation portions. In another embodiment, a power module may be full mold in which a metal heat radiation portion is not exposed from a molded member. In the above-described embodiments, the heat radiation sheet adheres the power module to the heat sink to radiate heat and secures isolation between the power module and the heat sink. In cases where a power module is full mold, a medium member may be made of material other than insulation material and the medium member does not have to function as an isolation member.

In the above-described embodiments, the sources of the lower MOSFETs and the slugs are coupled via the shunt resistors. In another embodiment, the sources of the MOSFETs and the slugs may be coupled via wires. In the present case, the shunt resistors may be disposed outside the power module or the shunt resistors may be omitted. In the above-described embodiment, the power terminals concentrate in the region adjacent to the first surface and the control terminals concentrate in the region adjacent to the second surface. In another embodiment, the power terminals and the control terminals may be disposed in a different manner with respect to the molded member. In the above-described embodiment, the driving apparatus includes two substrates, that is, the control substrate and the power substrate. In another embodiment, the number of substrate may be one. The extraction lines and the power module may also be coupled without the power substrate.

In the above-described embodiments, the semiconductor device is applied to the driving apparatus. The semiconductor device may also be applied to an apparatus other than the driving apparatus. While the present disclosure has been described with reference to embodiments thereof, it is to be understood that the disclosure is not limited to the embodiments and constructions. The present disclosure is intended to cover various modifications and equivalent arrangements.

What is claimed is:

1. A semiconductor device comprising:
a semiconductor module including a plurality of switching elements, a plurality of conductors, and a molded member, the switching elements being related to switching of electric current, each of the switching elements mounted on a corresponding one of the conductors, the molded member covering the switching elements and the conductors; and
a pressing member configured to press the semiconductor module to a heat radiation member,
wherein more than three of the switching elements are disposed around the pressing member,
wherein the switching elements are disposed in a region in which a pressure generated between the semiconductor module and the heat radiation member by pressing with the pressing member is greater than or equal to a predetermined pressure with which heat generated from the switching elements is releasable from the semiconductor module to the heat radiation member.

2. The semiconductor device according to claim 1,
wherein the molded member has a first surface and a second surface opposite from the first surface,
wherein the semiconductor module further includes a winding terminal protruding from the first surface and coupled with a winging and a control terminal protruding from the second surface and coupled with a control substrate.

3. The semiconductor device according to claim 1,
wherein the molded member has a middle line that is equidistant from the first surface and the second surface,
wherein the pressing member is disposed between the middle line and the second surface,
wherein one of the switching elements is disposed between the pressing member and the first surface, and
wherein another of the switching elements is disposed in a region from which a distance to the second surface is equal to a distance between the pressing member and the second surface.

4. The semiconductor device according to claim 3,
wherein four of the switching elements are disposed around the pressing member,
wherein two of the four switching elements are disposed between the pressing member and the first surface, and
wherein the other two of the four switching elements are disposed on either side of the pressing member and are disposed in the region from which the distance to the second surface is equal to the distance between the pressing member and the second surface.

5. The semiconductor device according to claim 3,
wherein the switching element disposed between the pressing member and the first surface is a high-potential side switching element coupled to a high potential side, and
wherein the switching element disposed in the region from which the distance to the second surface is equal to the distance between the pressing member and the second surface is a low-potential side switching element coupled to a low potential side of the high-potential side switching element.

6. The semiconductor device according to claim 1,
wherein the pressing member includes a screw.

7. The semiconductor device according to claim 1,
wherein the pressing member includes a spring member.

8. The semiconductor device according to claim 1, further comprising
a medium member disposed between the semiconductor module and the heat radiation member.

9. A driving apparatus comprising:
a motor including a winding; and
a control unit disposed on a side of the motor in an axial direction of the motor, the control unit including the semiconductor device according to claim 1 electrically coupled with the winding, the heat radiation member to which the semiconductor module is pressed with the pressing member, and a substrate electrically coupled with the semiconductor module.

* * * * *